United States Patent
Lin

(10) Patent No.: US 9,755,595 B1
(45) Date of Patent: Sep. 5, 2017

(54) SETTLING TIME REDUCTION FOR LOW NOISE AMPLIFIER

(71) Applicant: Avago Technologies General IP (Singapore) Pte. Ltd., Singapore (SG)

(72) Inventor: Saihua Lin, Santa Clara, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/130,691

(22) Filed: Apr. 15, 2016

(51) Int. Cl.
| | |
|---|---|
| H03G 3/30 | (2006.01) |
| H03G 1/00 | (2006.01) |
| H03K 19/21 | (2006.01) |
| H03F 3/193 | (2006.01) |
| H03F 1/02 | (2006.01) |
| H03F 1/30 | (2006.01) |

(52) U.S. Cl.
CPC .......... *H03G 1/0029* (2013.01); *H03F 3/193* (2013.01); *H03K 19/21* (2013.01); *H03F 1/0261* (2013.01); *H03F 1/30* (2013.01); *H03F 1/302* (2013.01); *H03F 2200/294* (2013.01); *H03F 2200/451* (2013.01)

(58) Field of Classification Search
CPC ........ H03G 1/0029; H03G 3/30; H03F 3/193; H03F 1/0261; H03F 1/30; H03F 1/302; H03F 1/301; H03F 3/04; H03F 2200/18; H03K 19/21
USPC .................................. 330/277, 285, 296, 311
See application file for complete search history.

(56) References Cited

U.S. PATENT DOCUMENTS

| | | | |
|---|---|---|---|
| 6,894,565 B1 | 5/2005 | Bocock et al. | |
| 7,956,682 B2 * | 6/2011 | Hasegawa | H03F 1/223 330/311 |
| 8,115,755 B2 | 2/2012 | Chia | |
| 8,248,290 B2 | 8/2012 | Payne | |
| 8,970,296 B1 * | 3/2015 | Pratt | H03F 1/3205 330/302 |
| 8,981,849 B2 * | 3/2015 | Song | H03F 1/302 330/285 |
| 9,337,787 B2 * | 5/2016 | Schooley | H03F 3/21 |
| 2015/0381123 A1 * | 12/2015 | Wu | H03F 3/19 330/282 |

* cited by examiner

*Primary Examiner* — Khanh V Nguyen

(57) ABSTRACT

A device includes: a transistor having an input terminal configured to receive an input signal and to amplify the input signal; a bias current source configured to set a bias current of the input terminal of the transistor, the bias current source having a control input for receiving a control signal for selecting the bias current to have one of a plurality of selectable bias current levels; a bias resistance connected between the bias current source and the input terminal of the transistor; a bypass switch for selectively bypassing a first part of the bias resistance; and a control circuit for controlling the bypass switch to bypass the part of the bias resistance for a predefined time period in response to a change in the bias current level, and for controlling the bypass switch to stop bypassing the first part of the bias resistance after the predefined time period expires.

15 Claims, 7 Drawing Sheets

SETTLING TIME REDUCTION FOR LOW NOISE AMPLIFIER

BACKGROUND

Low noise amplifiers (LNAs) are typically used in the front end stage of a radio frequency (RF) or microwave receiver, such as in a mobile telephone, to improve the receiver's sensitivity and ability to recover low power signals in the presence of noise. One of the most important parameters of a low noise amplifier is its noise figure, which should be kept as low as possible in order to successfully receive and recover signals at low power levels.

In some receivers, the received signal may have a wide range of input power levels. In that case, the low noise amplifier may be configured to selectively operate at different gain levels depending on the received signal level. That is, when the received signal level is low, the low noise amplifier may be controlled to operate in a high gain state with low noise, and when the received signal level is high, the low noise amplifier may operate in a reduced gain state where the noise figure is not as critical. In some low noise amplifiers, the amplifier may be selectively controlled or switched between more than two different gain levels or states, for example four, or eight, or more different gain levels. This is typically accomplished by changing the level of the bias current flowing through the low noise amplifier's transistor.

FIG. 1 illustrates an example of the output signal level of a low noise amplifier as the low noise amplifier is switched between various gain levels. As can be seen in FIG. 1, in each transition 110-1, 110-2, 110-3, 110-4 and 110-5, as the amplifier is switched from one gain state to another, the switching is not instantaneous but has a certain settling time before the amplifier output stabilizes to the new gain level.

Often there is a specification on the maximum allowable settling time for a low noise amplifier to switch between different gain levels or states. For example, in some receivers for mobile telephones, a maximum allowable settling time of 1 µsec. is specified for the low noise amplifier to settle to within 0.1 dB of its final output power level.

Typically, a dominant contributing factor to the setting time is an input RC time constant of the amplifier, which may be set by the parasitic input capacitance $C_P$ of the amplifier transistor and the impedance $R_B$ of the bias current source for the transistor. Thus to make the settling time faster, $R_B$ should be reduced. However, reducing $R_B$ also increases the noise figure for the low noise amplifier.

Thus there is a tension in conventional low noise amplifiers between achieving a fast settling time and providing a low noise figure.

What is needed, therefore, is a low noise amplifier which can achieve a fast settling time while providing a low noise figure.

SUMMARY

In one aspect of the inventive concept, a device comprises: a transistor having an input terminal configured to receive an input signal and to amplify the input signal; a bias current source configured to set a bias current of the input terminal of the transistor, the bias current source having a control input for receiving a control signal for selecting the bias current to have one of a plurality of selectable bias current levels; a bias resistance connected between the bias current source and the input terminal of the transistor; a bypass switch for selectively bypassing a first part of the bias resistance; and a control circuit for controlling the bypass switch to bypass the first part of the bias resistance for a predefined time period in response to a change in bias current level, and for controlling the bypass switch to stop bypassing the first part of the bias resistance after the predefined time period expires.

In one or more embodiments, the control signal comprises a digital control word, and the control circuit is configured to receive the control signal.

In one or more embodiments, the digital control word comprises a plurality of bits, and the control circuit detects a change in a value of at least one of the bits and in response thereto, controls the bypass switch to bypass the first part of the bias resistance for the predefined time period after the change in the value of at least one of the bits, and to stop bypassing the first part of the bias resistance after the predefined time period expires.

In one or more embodiments, the control circuit comprises a plurality of bit transition detection circuits each corresponding to one of the plurality of bits of the digital control word, each bit transition detection circuit having an output and being configured to produce at its output, in response to the corresponding bit changing its value, a corresponding bit change detection pulse having a pulse width corresponding to the predefined time period; and a logic circuit configured to logically combine output signals of the bit transition detection circuits and to produce a control pulse for controlling the bypass switch to bypass the first part of the bias resistance for the predefined time period in response to a bit change detection pulse in any of the outputs of the bit transition detection circuits.

In one or more embodiments, each of the bit transition detection circuits comprises a monostable multivibrator.

In one or more embodiments, each of the bit transition detection circuits comprises: at least two inverters and a delay circuit arranged in series and configured to receive the corresponding bit and to output a corresponding delayed bit; and an exclusive OR (XOR) gate configured to receive the corresponding bit and the delayed bit and in response thereto to output the bit change detection pulse when the corresponding bit changes its value.

In one or more embodiments, the logic circuit includes a NOR gate configured to receive at its inputs the output signals of the bit transition detection circuits and in response thereto to output the control pulse.

In one or more embodiments, the bypass switch comprises a P-channel field effect transistor.

In one or more embodiments, the logic circuit includes: a NOR gate configured to receive at its inputs the output signals of the bit transition detection circuits; and an inverter connected to an output of the NOR gate and to output the control pulse in response to the output signals of the bit transition detection circuits.

In one or more embodiments, the bypass switch comprises an N-channel field effect transistor.

In one or more embodiments, the device further comprises a cascode stage connected to the transistor, the cascode stage having an output terminal configured to output the amplified signal.

In one or more embodiments, the amplifying transistor is a field effect transistor (FET), the input terminal is a gate of the FET, and the cascode stage is connected to a drain of the FET.

In another aspect of the inventive concept, an amplifier comprises: an amplifying transistor having an input terminal configured to receive an input signal and to amplify the input signal; an adjustable current source configured to set a bias current of the input terminal of the amplifying transistor, the adjustable current source having a control input for receiving a digital control word for selecting the bias current to have one of a plurality of selectable bias current levels; a first resistor and a second resistor connected in series between the adjustable current source and the input terminal of the amplifying transistor; a transistor switch connected across the second resistor for selectively bypassing the second resistor; and a control circuit connected to a control terminal of the transistor switch, wherein the control circuit comprises: a plurality of bit transition detection circuits each corresponding to one of the plurality of bits of the digital control word, each bit transition detection circuit comprising: at least two inverters and a delay circuit arranged in series and configured to receive the corresponding bit and to output a corresponding delayed bit, and an exclusive OR (XOR) gate configured to receive the corresponding bit and the corresponding delayed bit and in response thereto to output a bit change detection pulse when a value of the corresponding bit changes, and a logic circuit configured to logically combine output signals of the XOR gates of the bit transition detection circuits and to produce a control pulse for controlling the transistor switch to bypass the second resistor for a predefined time period in response to a bit change detection pulse in any of the outputs of the bit transition detection circuits.

In one or more embodiments, the logic circuit includes a NOR gate configured to receive at its inputs the output signals of the bit transition detection circuits and in response thereto to output the control pulse.

In one or more embodiments, the transistor switch comprises a P-channel field effect transistor.

In one or more embodiments, the logic circuit includes: a NOR gate configured to receive at its inputs the output signals of the bit transition detection circuits; and an inverter connected to an output of the NOR gate and to output the control pulse in response to the output signals of the bit transition detection circuits.

In one or more embodiments, the transistor switch comprises an N-channel field effect transistor.

In one or more embodiments, the amplifier further comprises a cascode stage connected to the amplifying transistor, the cascode stage having an output terminal configured to output the amplified signal.

In one or more embodiments, the amplifying transistor is a field effect transistor (FET), the input terminal is a gate of the FET, and the cascode stage is connected to a drain of the FET.

In one or more embodiments, the first resistor is connected between the second resistor and the input terminal of the amplifying transistor.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
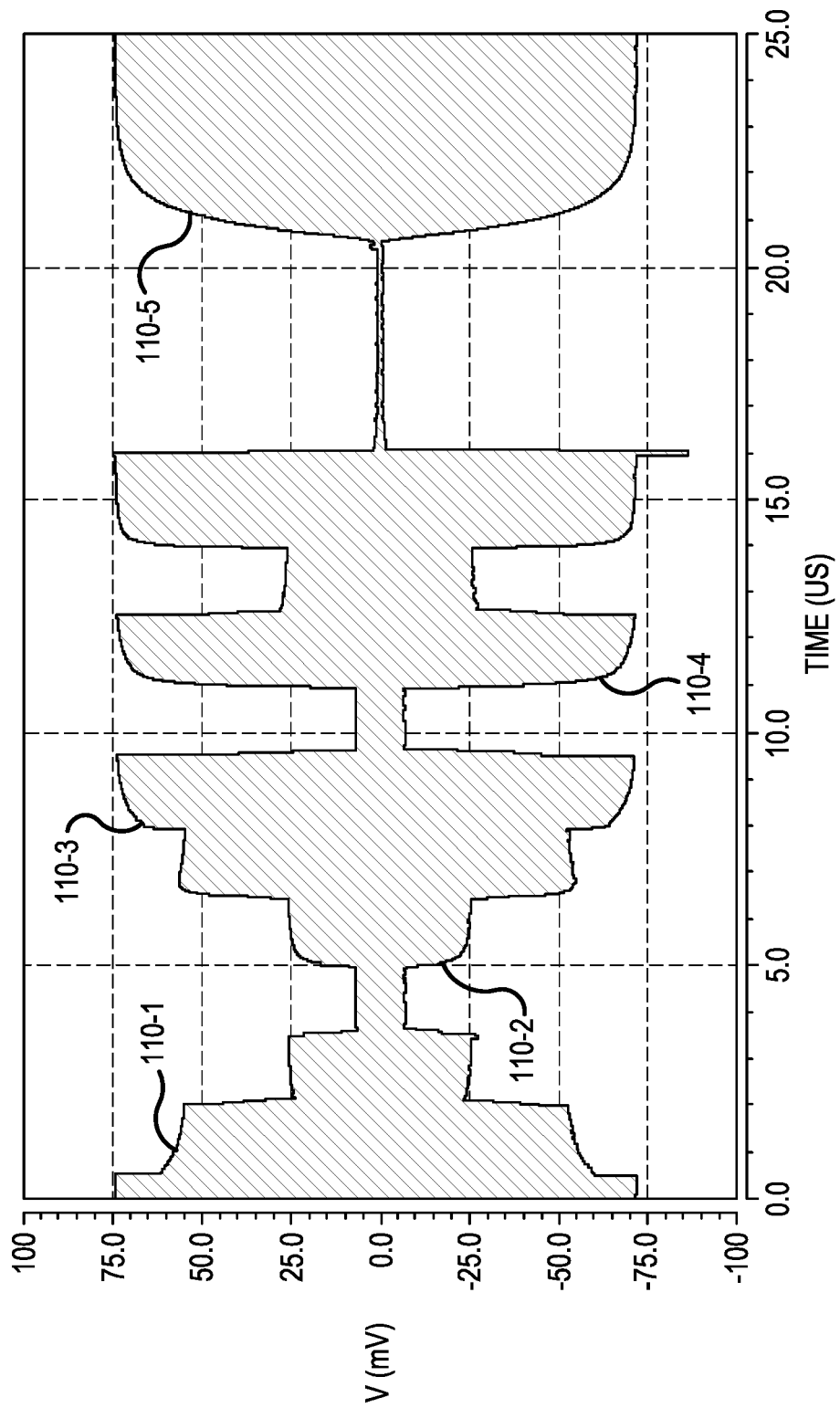
FIG. 1 illustrates an example of the output signal level of a low noise amplifier as the low noise amplifier is switched between various gain levels.

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

As used herein, "approximately" means within 10%. When two values are said to be "substantially the same" it means that the values are the same within the reasonable manufacturing tolerances. By contrast, "substantially different" means substantially not the same, and therefore "more different" than reasonable manufacturing tolerances.

Example amplifiers will be described below where the gain elements are field effect transistors (FETs). However, it should be understood that the principles described below can be extended to other types of gain elements, such as hetero junction bipolar transistors (HBTs), GaN FETs, GaAs PHEMTs, etc.

As discussed above in the Background, there is often a specification on the maximum allowable settling time for a low noise amplifier to switch between different gain levels or states. For example, in some receivers for mobile telephones, a maximum allowable settling time of 1 μsec. is specified for the low noise amplifier to settle to within 0.1 dB of its final output power level.

Typically, a dominant contributing factor to the setting time is an input RC time constant of the amplifier, which may be set by the parasitic input capacitance $C_P$ of the amplifier transistor and the impedance $R_B$ of the bias current source for the transistor. Thus to make the settling time faster, $R_B$ should be reduced. However, reducing $R_B$ also increases the noise figure for the low noise amplifier.

Thus there is a tension in conventional low noise amplifiers between achieving a fast settling time and providing a low noise figure.

Various embodiments of low noise amplifiers described herein may address in whole or in part the tension between achieving a fast settling time and providing a low noise figure.

Figure 2:
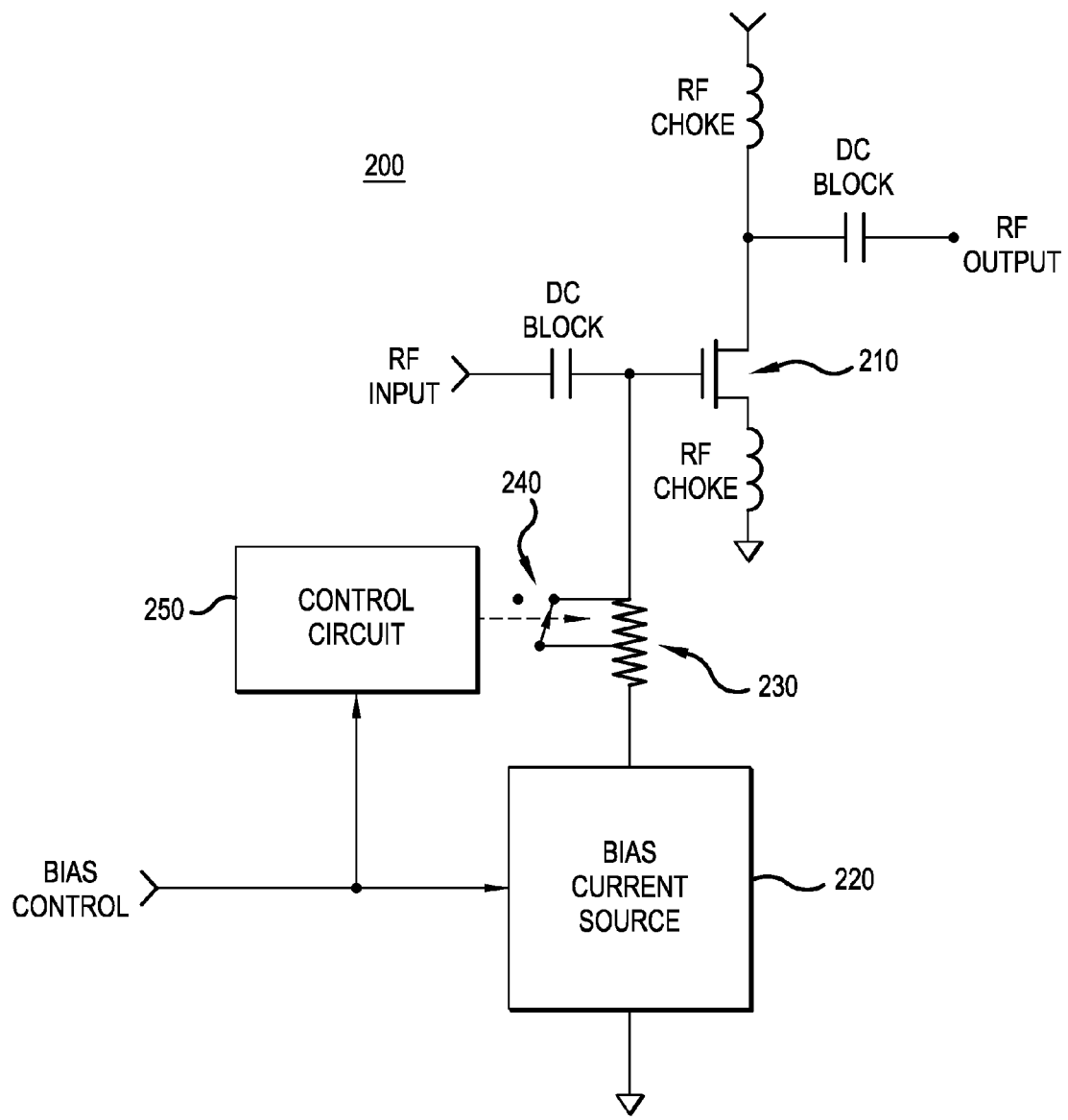
FIG. 2 is a functional block diagram of an example embodiment of a low noise amplifier.

FIG. 2 is a functional block diagram of an example embodiment of a low noise amplifier (LNA) 200. LNA 200 includes: an LNA transistor 210 having an input terminal configured to receive an input signal ("RF Input") and to amplify the input signal; a bias current source 220 configured to set a bias current of the input terminal of LNA transistor 210, the bias current source having a control input for receiving a control signal ("Bias Control") for selecting the bias current to have one of a plurality of selectable bias current levels; a bias resistance 230 ($R_B$) connected between bias current source 220 and the input terminal of LNA transistor 210; a bypass switch 240 for selectively bypassing a first part of bias resistance 230; and a control circuit 250 for controlling bypass switch 240 to bypass the first part of bias resistance 230 for a predefined time period (hereinafter referred to as $T_{PULSE}$) in response to a change in the bias current level, and for controlling bypass switch 240 to stop bypassing the first part of bias resistance 230 after the predefined time period expires.

As can be seen from FIG. 2, LNA transistor 210 is a field effect transistor (FET) which receives the RF Input signal (via a DC blocking capacitor) at its gate and which outputs the amplified RF Output signal at its drain (via another DC blocking capacitor). The DC blocking capacitors have very low impedance at the operating frequency range of LNA 200, which in some embodiments may be in a range of 1.5-3.5 GHz for example. Typically LNA 200 includes RF chokes (coils/inductors) in the drain and source branches of LNA transistor 210.

Bias current source 220 receives the Bias Control signal and in response thereto controls or selects the bias level of LNA transistor 210, and accordingly the operating gain of LNA 200. In some embodiments, bias current source 220 may comprise an adjustable current source whose current is set in response to the Bias Control signal, and may include a current mirror for setting the bias current for LNA transistor 210. Although in general the Bias Control signal may be an analog or digital signal, beneficially the Bias Control signal may be a digital word wherein the number of bits N (e.g., N=3) of the digital word determines the number of different gain levels (e.g., eight) for LNA 200.

As indicated in FIG. 2, the Bias Control signal which controls the bias current supplied by Bias current source 220 is also provided as an input to control circuit 250. Accordingly, whenever there is a change in the Bias Control signal, which produces a change in the gain level of LNA 200, this change is also presented to control circuit 250 which may respond by controlling bypass switch 240 to selectively bypass a first part of bias resistance 230 for a short period of time, $T_{PULSE}$, in response to the change in the Bias Control signal.

In particular, when the Bias Control signal is a digital word having a number of bits N, then control circuit 250 may detect a change in a value of at least one of the bits (indicating a change in the gain level of LNA 200) and in response thereto, may control bypass switch 240 to bypass the first part of bias resistance 230 for a predefined time period, $T_{PULSE}$, and to stop bypassing the first part of bias resistance 230 after the predefined time period expires.

In some embodiments, the first part of bias resistance 230 may be the majority of bias resistance 230, for example even 90% or more of bias resistance 230. Thus, for example, if bias resistance 230 is 400 kΩ, the first part of bias resistance 230 which is bypassed for the short time period ($T_{PULSE}$) after the change in the Bias Control signal may be 360 kΩ. This substantial reduction in $R_B$ may substantially reduce the input RC time constant of LNA 200, and therefore may substantially reduce the settling time or LNA 200 when switching from one gain level to another. Meanwhile, once LNA 200 has settled to its new gain level, the bias resistance $R_B$ may be substantially increased automatically by bypass switch 240 opening after the short time period $T_{PULSE}$ has elapsed, thereby restoring once again the high input impedance of LNA 200 and its corresponding noise figure. By careful selection of the bias resistance 230, the first part of bias resistance 230 which is bypassed, and the time period $T_{PULSE}$, the noise figure of LNA 200 may be increased only for approximately the same period of time required for the output power level to settle within a desired delta (e.g., 0.1 db) from its final value, and then the input impedance and noise figure are changed back to their desired "nominal" values. In some embodiments, the time period $T_{PULSE}$ may be on the order of 1 psec.

Further details of operation of LNA 200 may become clearer with reference to example embodiments described below.

Figure 3:
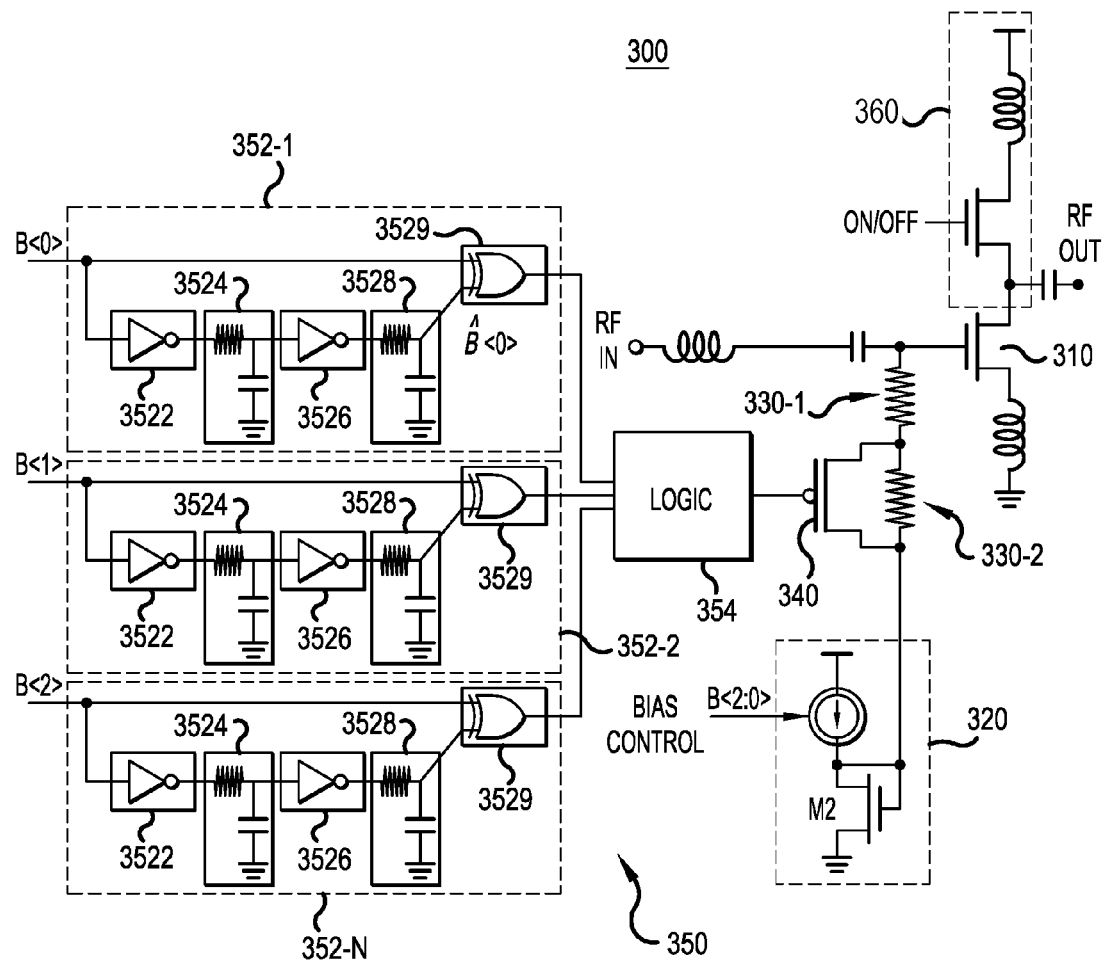
FIG. 3 is a circuit diagram of an example embodiment of a low noise amplifier.

FIG. 3 is a circuit diagram of an example embodiment of a low noise amplifier (LNA) 300. LNA 300 may be one example embodiment of LNA 200.

LNA 300 includes: an amplifying transistor (i.e., LNA transistor) 310, an adjustable current source 320, a first resistor 330-1 and a second resistor 330-2, a transistor switch 340, and a control circuit 350. Control circuit 350 includes: a plurality of bit transition detection circuits 352-1, 352-2 . . . 352-N; and a logic circuit 354, where N equals the number of bits in a digital control word ("B<(N–1):0>") which serves as the Bias Control signal. In the illustrated embodiment N=3, so there are three bit transition detection circuits 352-1, 352-2 and 352-3. Each of the bit transition detection circuits 352-1, 352-2 and 352-3 includes: at least two inverters 3522 and 3526, a delay element or circuit 3524, and an exclusive OR (XOR) gate 3529. In the illustrated example, each of the bit transition detection circuits 352-1, 352-2 and 352-3 also includes a second delay element or circuit 3528.

LNA 300 also includes an optional cascode stage 360 which may be controlled selectively to turn LNA 300 ON and OFF.

Amplifying transistor (e.g., a FET) 310 has an input terminal (e.g., the gate) configured to receive an input signal ("RF In") and to amplify the input signal RF In to produce an amplified output signal ("RF Out").

Adjustable current source 320 is configured to set a bias current of the input terminal of amplifying transistor 310, adjustable current source 320 having a control input for receiving a digital control word ("B<(N–1):0>") (e.g., B<2:0> for a case where the number of bits N=3) as the Bias Control signal for selecting the bias current to have one of a plurality of selectable bias current levels. Bias current source 320 may include an adjustable current source whose current is set in response to the Bias Control signal, and a transistor M2.

First resistor 330-1 and second resistor 330-2 are connected in series between adjustable current source 320 and the input terminal of amplifying transistor 310. In some embodiments, second resistor 330-2 has a resistance which is much greater than the resistance of first resistor 330-1. In some embodiments, second resistor 330-2 has a resistance which is nine times, or ten times, the resistance of first resistor 330-1, or more. For example, in some embodiments second resistor 330-2 may have as a resistance of about 400 kΩ and first resistor 330-1 may have a resistance which is less than 40 kΩ, for example about 10 kΩ.

Transistor switch (e.g., a FET) 340 is connected across second resistor 330-2 for selectively bypassing second resistor 330-2, and therefore functions as a bypass switch. Transistor switch 340 may be a P-channel FET. Control circuit 350 (and in particular logic circuit 354) has an output which is connected to the control terminal (e.g., gate) of transistor switch 340.

Bit transition detection circuits 352-1, 352-2 and 352-3, each correspond to one of the plurality of bits of the digital control word B<2:0> (e.g., B<0>, B<1> and B<2>) and the configuration and operation of bit transition detection circuits 352-1, 352-2 and 352-3 may be substantially the same as each other. In one or more embodiments, each of the bit transition detection circuits 352-1, 352-2 and 352-3 comprises a monostable multivibrator.

Figure 4:
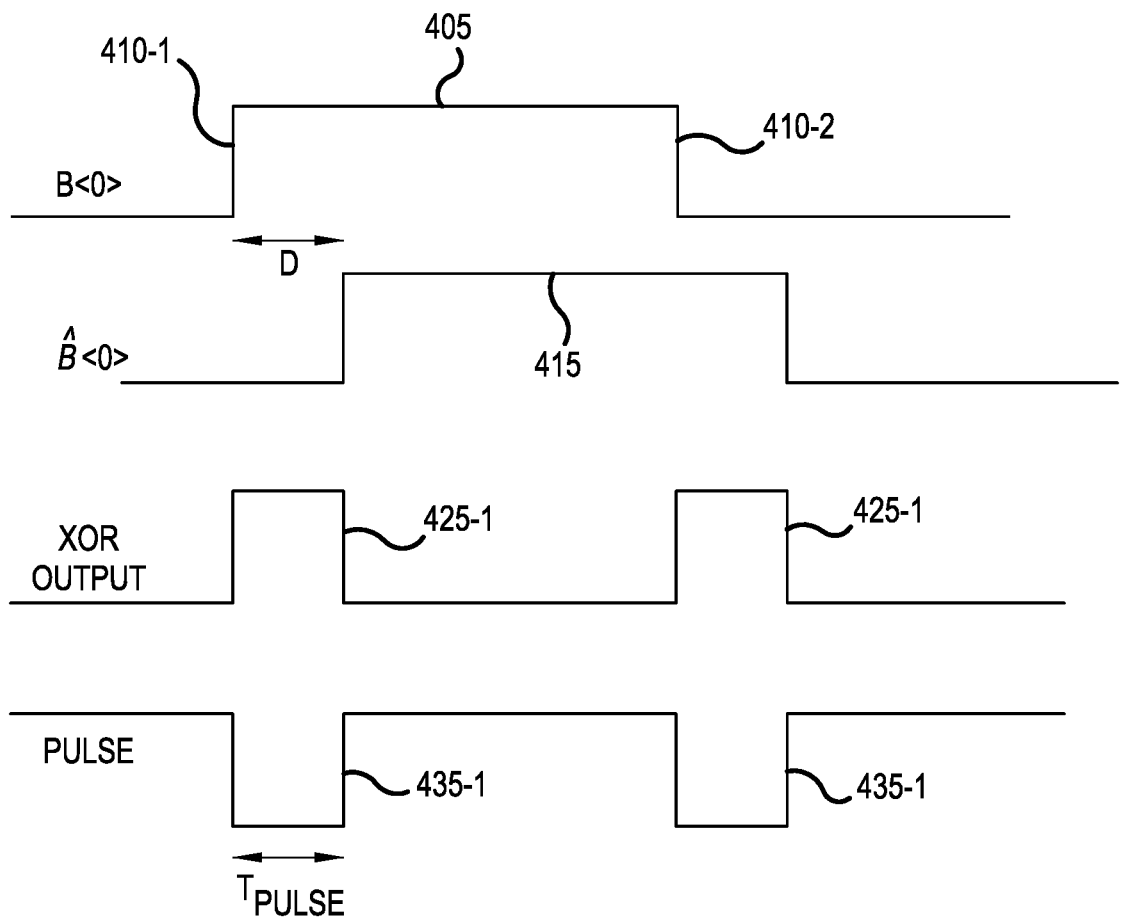
FIG. 4 shows various signals of an example embodiment of a low noise amplifier.

Example operations of LNA 300 will now be described with respect FIG. 4, which illustrates various signals when a bit transistor occurs for one bit (e.g., "B<0>") of the Bias Control signal. In particular, FIG. 4 illustrates operation of bit transition detection circuit 352-1 and logic circuit 354 in response to changes or transitions 410-1 and 410-2 in bit B<0> (signal 405 in FIG. 4).

The serial arrangement of inverter 3522, delay circuit 3524, inverter 3526, delay circuit 3528 is configured to receive the corresponding bit (e.g., B<0>) and in response thereto to output a delayed version of the bit B̂<0>, with the time delay D being determined by the combination of delay circuits 3524 and 3528.

Exclusive OR (XOR) gate 3529 is configured to receive the corresponding bit (e.g., B<0>) and the corresponding delayed bit B̂<0>, and in response thereto to output a bit change detection pulse 425-1 when the value of bit B<0> changes (i.e., when bit B<0> changes from a "0" to a "1" or changes from a "1" to a "0"), indicating a change in the gain level of LNA 300.

Logic circuit 354 is configured to logically combine output signals of the XOR gates 3529 of bit transition detection circuits 352-1, 352-2 and 352-3 and to produce a control pulse 435-1 having a predetermined or predefined time period $T_{PULSE}$ for controlling transistor switch 340 to bypass second resistor 330-2 for the predefined time period $T_{PULSE}$ in response to a bit change detection pulse 425-1 in any of the outputs of bit transition detection circuits 352-1, 352-2 and 352-3.

The output signal of logic circuit 354 is coupled to the control terminal (gate) of transistor switch 340.

The output signal of logic circuit 354 is normally "high" in which case transistor switch 340 is "opened" or turned off. However, in response to a change in the level of any of the bits of the digital control word B<2:0> (which in turn changes the gain level of LNA 300), logic circuit 354 outputs a control pulse 435-1 which is "low" for a predefined time period $T_{PULSE}$, thereby turning on or "closing" transistor switch 340 for the duration of the predefined time period $T_{PULSE}$. During this predefined time period $T_{PULSE}$, while transistor switch 340 is turned on or closed, second resistor 330-2 is bypassed, thereby reducing the total bias resistance, for example in some embodiments by 90% or more. This may substantially reduce the input RC time constant of LNA 300, and therefore may substantially reduce the settling time or LNA 300 when switching from one gain level to another.

Meanwhile, once predefined time period $T_{PULSE}$ has expired, beneficially after LNA 300 may have settled to its new gain level, transistor switch 340 is turned off or opened again, thereby restoring once again the high input impedance of LNA 300 and its corresponding noise figure. By careful selection of the first resistor 330-1, second resistor 330-2, and the time period $T_{PULSE}$, the noise figure of LNA 300 may be increased only for approximately the same period of time required for the output power level to settle within a desired delta (e.g., 0.1 db) from its final value, and then the input impedance and noise figure are changed back to their desired "nominal" values. In some embodiments, the time period $T_{PULSE}$ may be on the order of 1 µsec.

Figure 5:
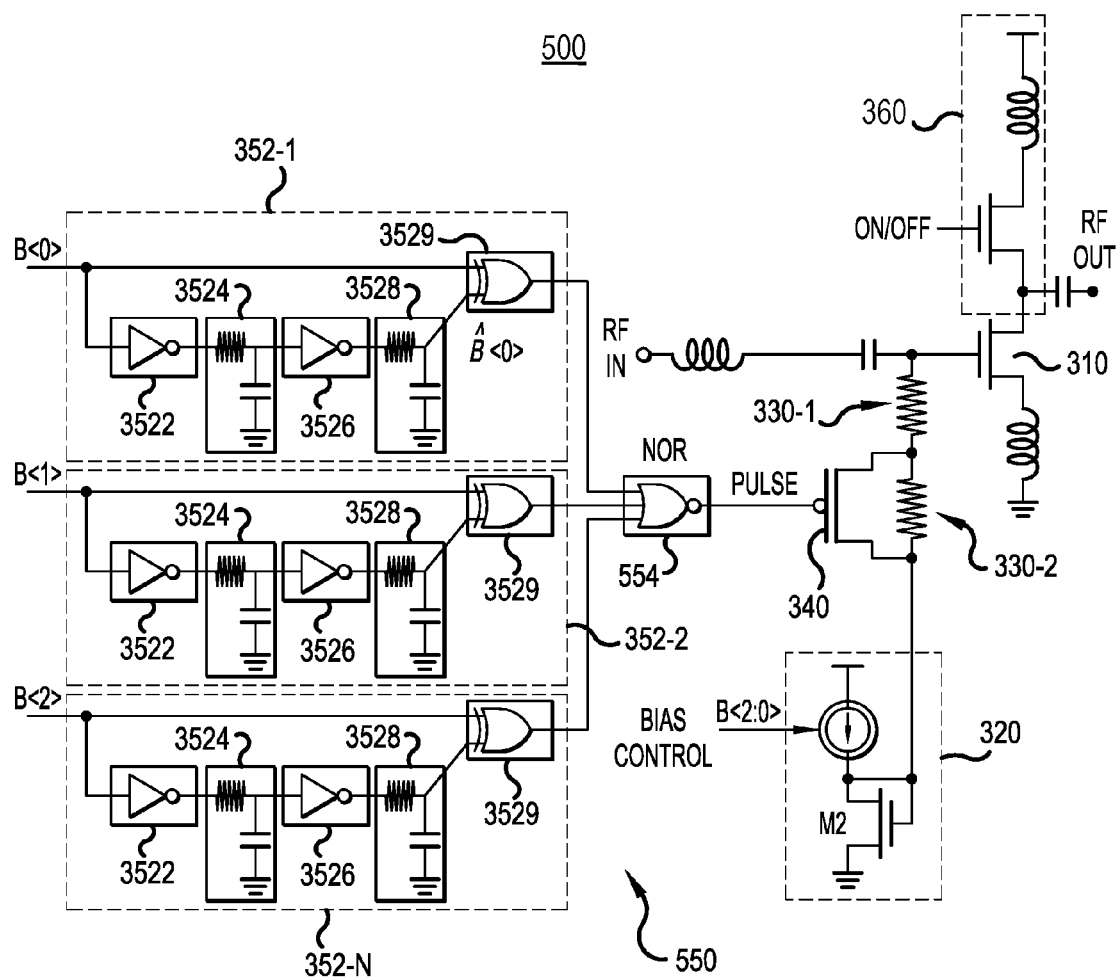
FIG. 5 is a circuit diagram of another example embodiment of a low noise amplifier.

FIG. 5 is a circuit diagram of another example embodiment of a low noise amplifier 500. Low noise amplifier 500 is an embodiment of low noise amplifier 400 having a control circuit 550 where logic circuit 354 comprises a NOR gate 554. It should be understood that other configurations of logic within logic circuit 354 are possible. The remaining configuration and operation of low noise amplifier 500 are the same as for low noise amplifier 400 and descriptions thereof will not be repeated.

Figure 6:
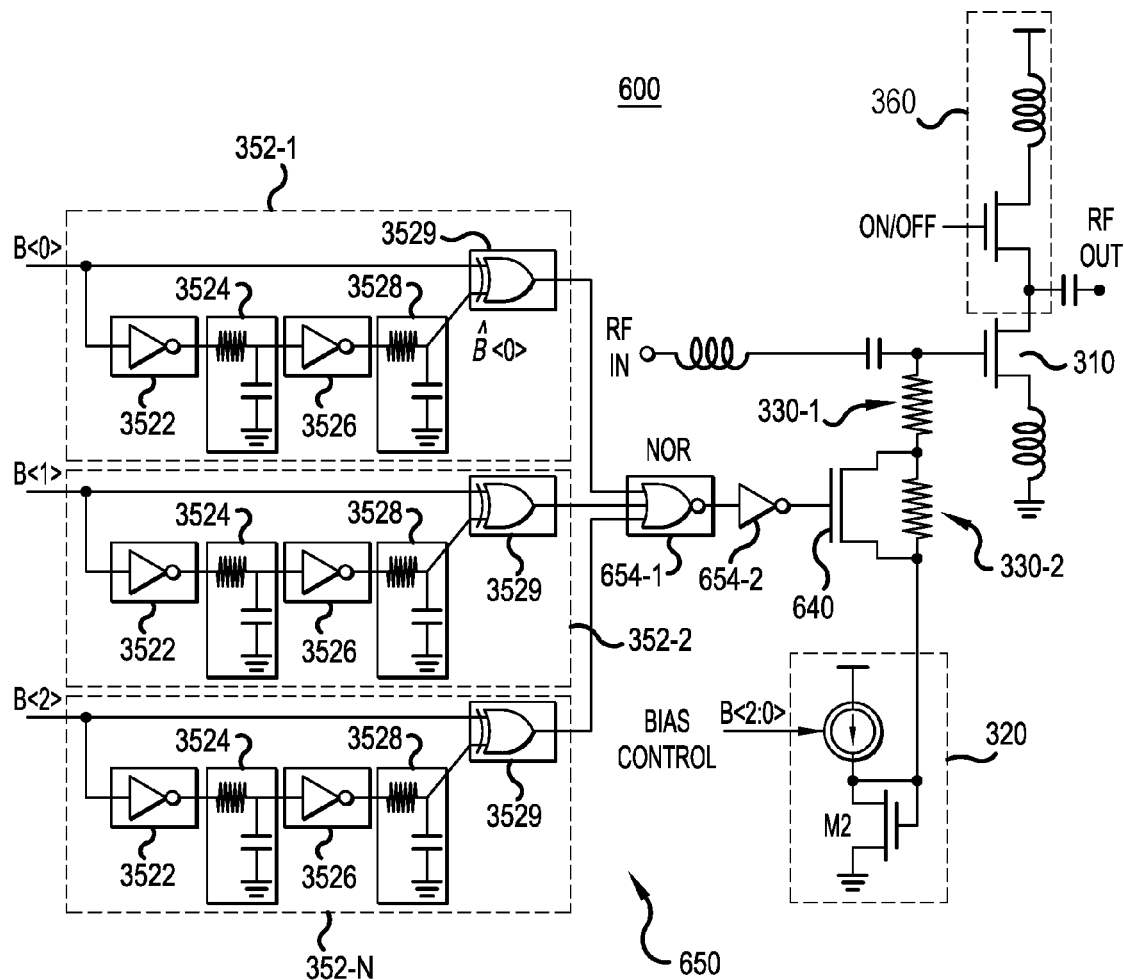
FIG. 6 is a circuit diagram of yet another example embodiment of a low noise amplifier.

FIG. 6 is a circuit diagram of yet another example embodiment of a low noise amplifier 600. Low noise amplifier 600 differs from low noise amplifier 400 in that transistor switch 640 is turned off (opened) when the signal at the control terminal (gate) is low, and is turned on (closed) when the signal at the control terminal (gate) is high. Transistor switch 640 may be an N-channel FET. Thus, a positive pulse is required at the control terminal (gate) of transistor switch 640 in response to a change in any of the bits of the digital control word B<2:0> (which in turn changes the gain level of LNA 600). Toward this end, low noise amplifier 600 includes a control circuit 650 having NOR gate 654-1 and inverter 654-2 in place of logic circuit 354.

Figure 7:
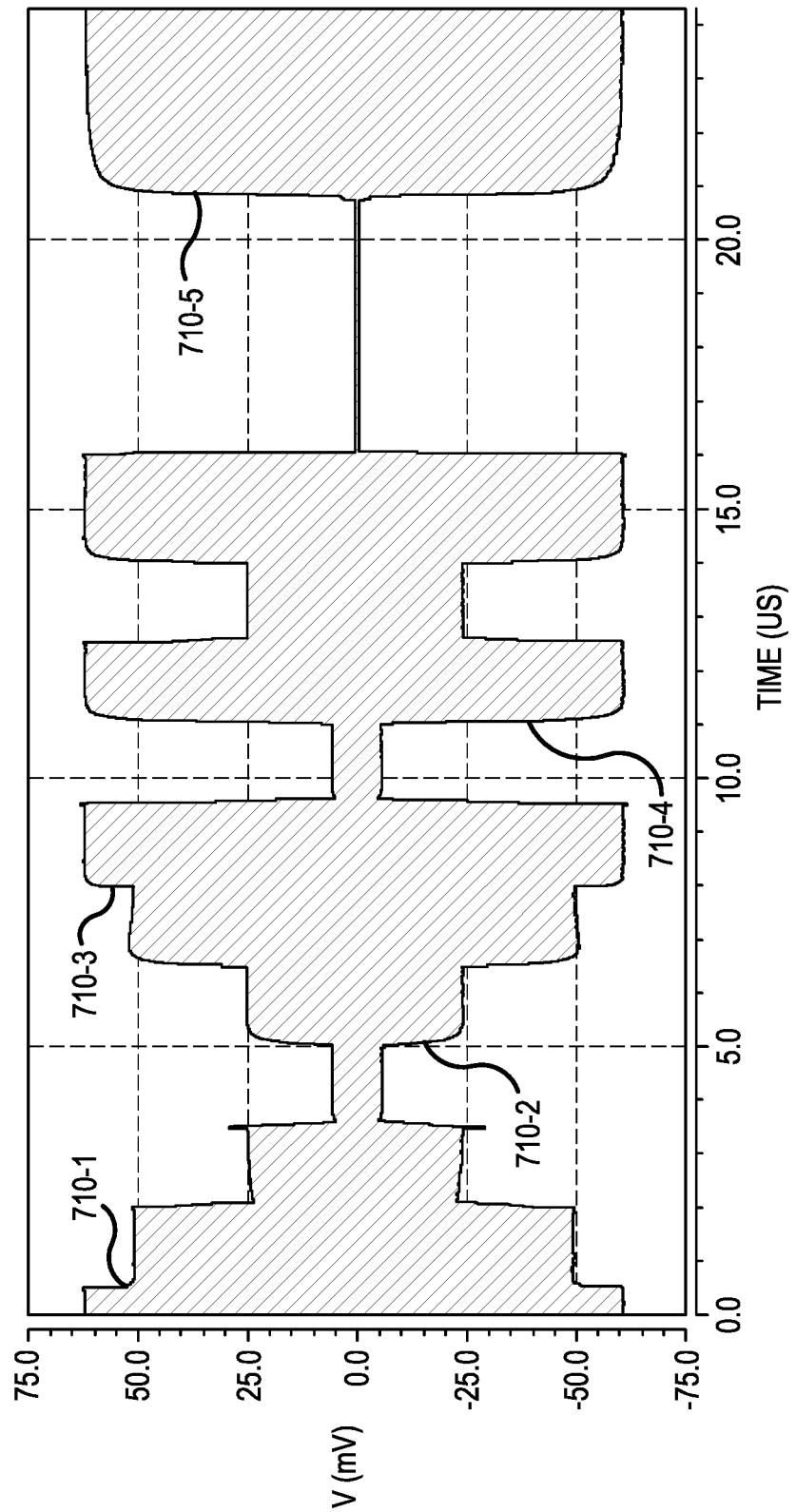
FIG. 7 illustrates an example of the output signal level of a low noise amplifier such as that illustrated in FIG. 5 as the low noise amplifier is switched between various gain levels.

FIG. 7 illustrates an example of the output signal level of a low noise amplifier, such as low noise amplifier 500, as the low noise amplifier is switched between various gain levels. As can be seen in FIG. 7 in comparison to FIG. 1, in each transition 710-1, 710-2, 710-3, 710-4 and 710-5, as the low noise amplifier is switched from one gain state to another, the switching has a faster settling time for the amplifier output to stabilize to the new gain level than in an amplifier whose performance is illustrated in FIG. 1.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A device, comprising:
  a transistor having an input terminal configured to receive an input signal and to amplify the input signal;
  a bias current source configured to set a bias current of the input terminal of the transistor, the bias current source having a control input for receiving a control signal for selecting the bias current to have one of a plurality of selectable bias current levels;
  a bias resistance connected between the bias current source and the input terminal of the transistor;
  a bypass switch for selectively bypassing a first part of the bias resistance; and a control circuit for controlling the bypass switch to bypass the first part of the bias resistance for a predefined time period in response to a change in bias current level, and for controlling the bypass switch to stop bypassing the first part of the bias resistance after the predefined time period expires, wherein the control signal comprises a digital control word, and wherein the control circuit is configured to receive the control signal.

2. The device of claim 1, wherein the digital control word comprises a plurality of bits, and wherein the control circuit detects a change in a value of at least one of the bits and in response thereto, controls the bypass switch to bypass the first part of the bias resistance for the predefined time period after the change in the value of at least one of the bits, and to stop bypassing the first part of the bias resistance after the predefined time period expires.

3. The device of claim 2, wherein the control circuit comprises:

a plurality of bit transition detection circuits each corresponding to one of the plurality of bits of the digital control word, each bit transition detection circuit having an output and being configured to produce at its output, in response to the corresponding one of the plurality of bits' changing its value, a corresponding bit change detection pulse having a pulse width corresponding to the predefined time period; and a logic circuit configured to logically combine output signals of the bit transition detection circuits and to produce a control pulse for controlling the bypass switch to bypass the first part of the bias resistance for the predefined time period in response to a bit change detection pulse in any of the outputs of the bit transition detection circuits.

4. The device of claim 3, wherein each of the bit transition detection circuits comprises a monostable multivibrator.

5. The device of claim 3, wherein each of the bit transition detection circuits comprises:

at least two inverters and a delay circuit arranged in series and configured to receive the corresponding one of the plurality of bits and to output a corresponding delayed bit; and an exclusive OR (XOR) gate configured to receive the corresponding one of the plurality of bits, and the corresponding delayed bit and in response thereto to output the bit change detection pulse when the corresponding one of the plurality of bits changes its value.

6. The device of claim 3, wherein the logic circuit includes a NOR gate configured to receive at its inputs the output signals of the bit transition detection circuits and in response thereto to output the control pulse.

7. The device of claim 6, wherein the bypass switch comprises a P-channel field effect transistor.

8. The device of claim 3, wherein the logic circuit includes:

a NOR gate configured to receive at its inputs the output signals of the bit transition detection circuits; and an inverter connected to an output of the NOR gate and to output the control pulse in response to the output signals of the bit transition detection circuits.

9. The device of claim 6, wherein the bypass switch comprises an N-channel field effect transistor.

10. An amplifier, comprising:

an amplifying transistor having an input terminal configured to receive an input signal and to amplify the input signal;

an adjustable current source configured to set a bias current of the input terminal of the amplifying transistor, the adjustable current source having a control input for receiving a digital control word for selecting the bias current to have one of a plurality of selectable bias current levels;

a first resistor and a second resistor connected in series between the adjustable current source and the input terminal of the amplifying transistor;

a transistor switch connected across the second resistor for selectively bypassing the second resistor; and a control circuit connected to a control terminal of the transistor switch, wherein the control circuit comprises:

a plurality of bit transition detection circuits each corresponding to one of the plurality of bits of the digital control word, each bit transition detection circuit comprising:

at least two inverters and a delay circuit arranged in series and configured to receive the corresponding one of the plurality of bits, and to output a corresponding delayed bit, and an exclusive OR (XOR) gate configured to receive the corresponding one of the plurality of bits, and the corresponding delayed bit and in response thereto to output a bit change detection pulse when a value of the corresponding one of the plurality of bits changes, and a logic circuit configured to logically combine output signals of the XOR gates of the bit transition detection circuits and to produce a control pulse for controlling the transistor switch to bypass the second resistor for a predefined time period in response to a bit change detection pulse in any of the outputs of the bit transition detection circuits.

11. The amplifier of claim 10, wherein the logic circuit includes a NOR gate configured to receive at its inputs the output signals of the bit transition detection circuits and in response thereto to output the control pulse.

12. The amplifier of claim 11, wherein the transistor switch comprises a P-channel field effect transistor.

13. The amplifier of claim 10, wherein the logic circuit includes:

a NOR gate configured to receive at its inputs the output signals of the bit transition detection circuits; and an inverter connected to an output of the NOR gate and to output the control pulse in response to the output signals of the bit transition detection circuits.

14. The amplifier of claim 13, wherein the transistor switch comprises an N-channel field effect transistor.

15. The amplifier of claim 10, wherein the first resistor is connected between the second resistor and the input terminal of the amplifying transistor.

* * * * *